US012575035B2

(12) United States Patent

Eckert et al.

(10) Patent No.: US 12,575,035 B2

(45) Date of Patent: Mar. 10, 2026

(54) BALL GRID ARRAY SOLDER PAD TRIMMING

(71) Applicant: International Business Machines Corporation, Armonk, NY (US)

(72) Inventors: Stanley Eckert, Poughkeepsie, NY (US); Steven Louis Makow, Poughkeepsie, NY (US); Todd Edward Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 847 days.

(21) Appl. No.: 17/654,761

(22) Filed: Mar. 14, 2022

(65) Prior Publication Data

US 2023/0292447 A1 Sep. 14, 2023

(51) Int. Cl.
| | |
|---|---|
| *H05K 3/34* | (2026.01) |
| *H01L 23/00* | (2006.01) |
| *H01L 23/498* | (2006.01) |

(52) U.S. Cl.
CPC ..... *H05K 3/3463* (2013.01); *H01L 23/49816* (2013.01); *H01L 24/13* (2013.01); *H01L 24/81* (2013.01); *H01L 2224/13014* (2013.01); *H01L 2224/13147* (2013.01); *H01L 2924/15311* (2013.01)

(58) Field of Classification Search
CPC . H01L 2224/48227; H01L 2224/48237; H01L 2224/48228; H01L 2224/48229; H01L 2224/0605–06051; H01L 2224/04042; H01L 2224/08052–0807; H01L 24/85; H01L 24/04–09; H01L 24/47–49; H01L 2224/0613; H01L 2224/06132–06136; H01L 2224/0615; H01L 2224/06152–06156; H01L 2224/06051; H01L 2224/0805–08056; H01L 2224/0905; H01L 2224/09051; H05K 1/0237; H05K 1/0245; H05K 1/11–114

See application file for complete search history.

(56) References Cited

U.S. PATENT DOCUMENTS

| | | | |
|---|---|---|---|
| 6,037,547 | A | 3/2000 | Blish, II |
| 7,208,348 | B2 | 4/2007 | Geng et al. |
| 7,906,835 | B2 | 3/2011 | Romero |
| 7,954,081 | B2 | 5/2011 | Bartley et al. |

(Continued)

FOREIGN PATENT DOCUMENTS

WO 2004051748 A1 6/2004

*Primary Examiner* — Julio J Maldonado
*Assistant Examiner* — Eric Manuel Mulero Flores
(74) *Attorney, Agent, or Firm* — Kimberly Zillig

(57) ABSTRACT

A passive circuit element is disclosed. The passive circuit element includes an array of conductive pads arranged on a substrate such that a gap is formed between each of the conductive pads. The passive circuit element further includes a first wire electrically connected to a first conductive pad of the array of conductive pads such that the first wire passes through a first gap formed between a second conductive pad and a third conductive pad. The passive circuit element further includes a second wire electrically connected to a fourth conductive pad of the array of conductive pads such that the second wire passes through the first gap. At least one of the second and third conductive pads has a substantially planar side facing toward the first gap.

17 Claims, 7 Drawing Sheets

(56) References Cited

U.S. PATENT DOCUMENTS

| | | | | |
|---|---|---|---|---|
| 8,629,550 | B2* | 1/2014 | Hirose | H05K 1/115 |
| | | | | 257/E23.152 |
| 10,658,279 | B2 | 5/2020 | Ganesan et al. | |
| 10,966,311 | B2 | 3/2021 | Kim et al. | |
| 2002/0109226 | A1* | 8/2002 | Khan | H01L 23/50 |
| | | | | 257/E23.079 |
| 2004/0164431 | A1* | 8/2004 | Seaman | H05K 1/181 |
| | | | | 257/E23.079 |
| 2005/0090040 | A1 | 4/2005 | Geng et al. | |
| 2005/0093152 | A1* | 5/2005 | Fjelstad | H01L 23/49816 |
| | | | | 257/E23.07 |
| 2005/0104172 | A1* | 5/2005 | Awujoola | H01L 23/49838 |
| | | | | 257/E23.101 |
| 2009/0045508 | A1 | 2/2009 | Romero | |
| 2009/0102056 | A1 | 4/2009 | Yu et al. | |
| 2009/0138832 | A1 | 5/2009 | Bartley et al. | |
| 2011/0284841 | A1* | 11/2011 | Kondou | H01L 24/14 |
| | | | | 257/E23.079 |
| 2019/0172778 | A1 | 6/2019 | Ganesan et al. | |
| 2019/0239339 | A1* | 8/2019 | Chandra | H04B 3/32 |
| 2020/0375024 | A1 | 11/2020 | Kim et al. | |

* cited by examiner

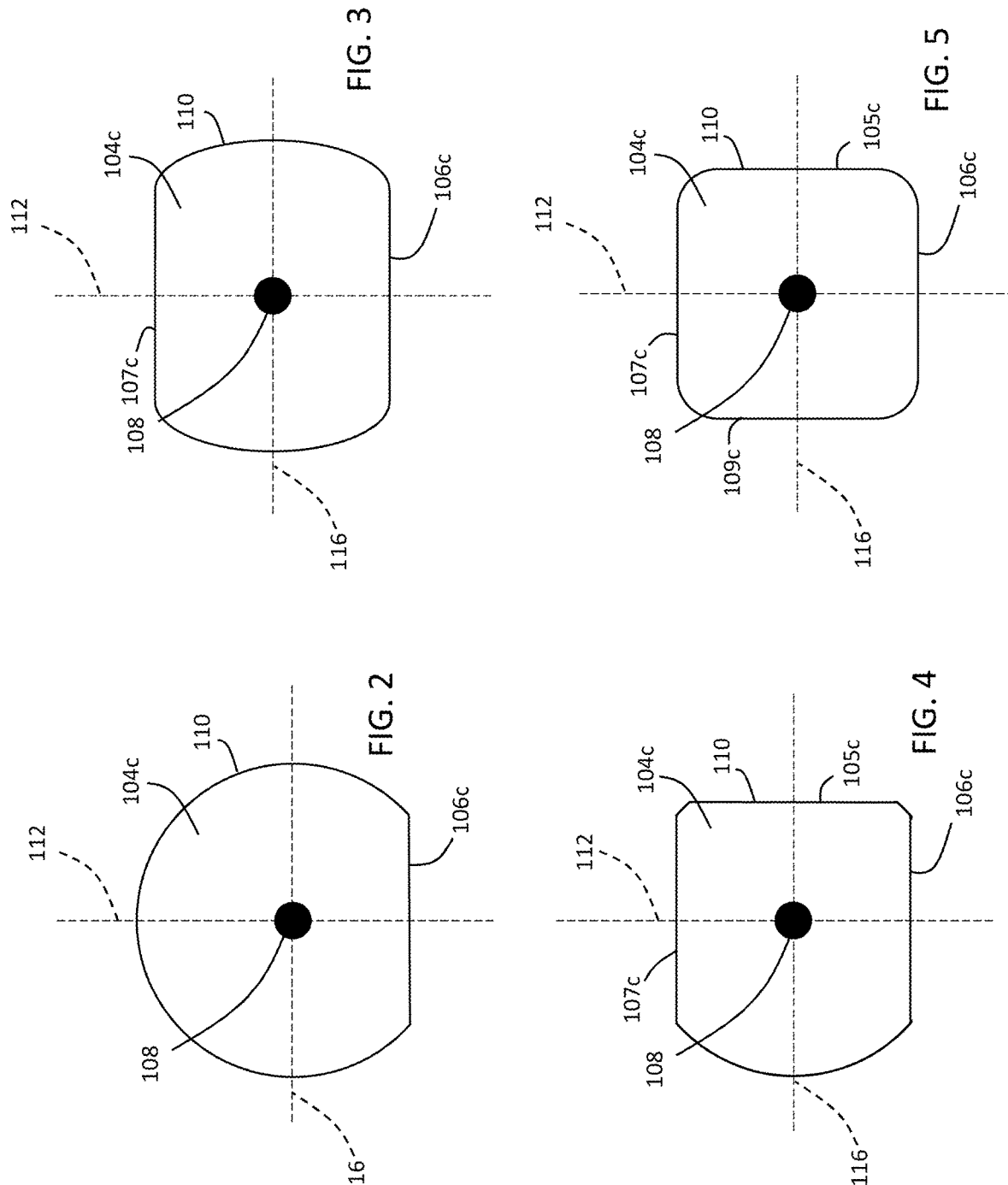

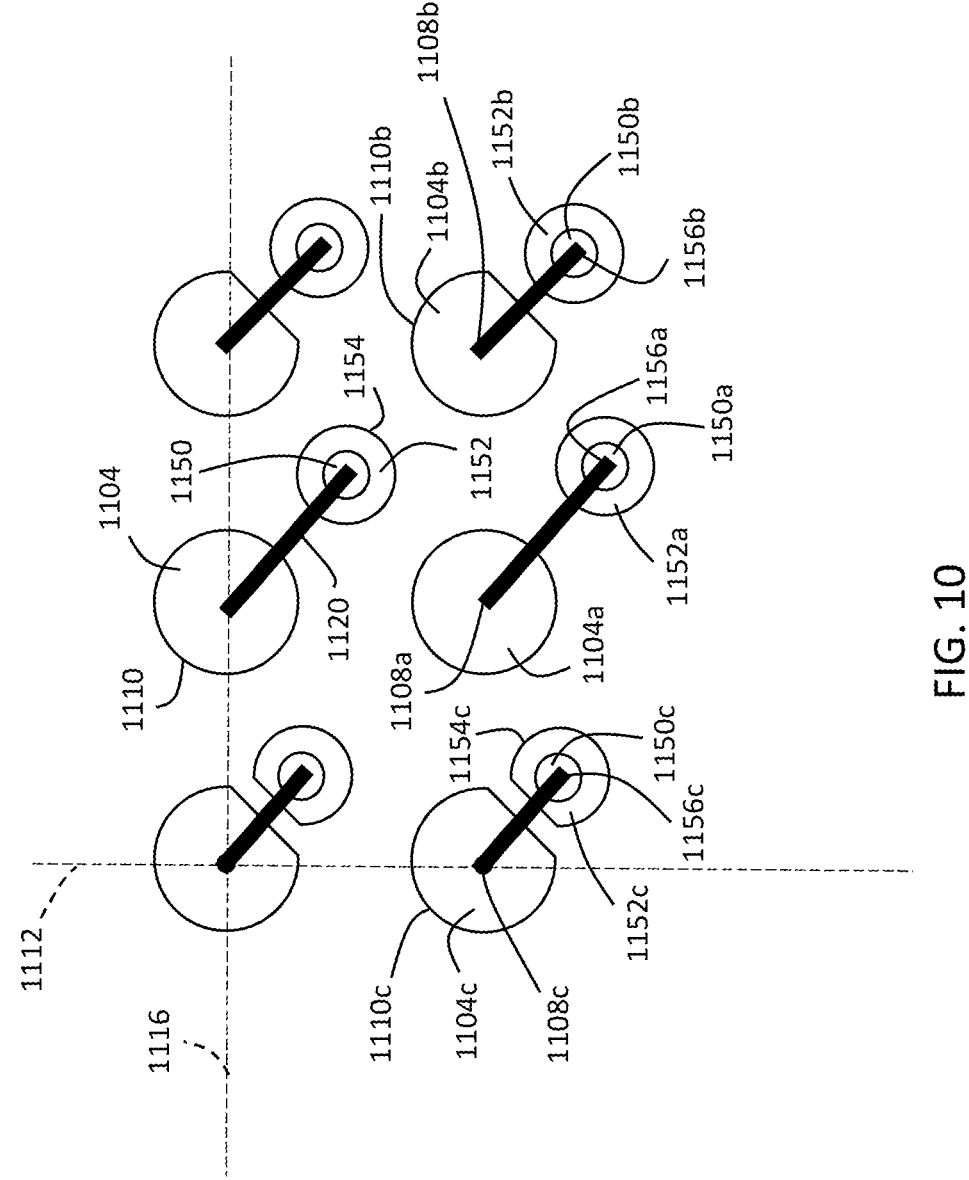
FIG. 10

BALL GRID ARRAY SOLDER PAD TRIMMING

BACKGROUND

The present disclosure relates to the electrical, electronic, and computer fields. In particular, the present disclosure relates to electronic devices commonly assembled in electronic packages.

An integrated circuit (also referred to as a chip) is a set of electronic circuits on a small flat piece of semiconductor material. Chips are typically packaged in a supporting case that prevents physical damage and corrosion to the device. The case, also known as a "package," supports the electrical contacts which connect the device to a circuit board.

A ball grid array (BGA) is a type of surface-mount arrangement on a package that is used to permanently mount a device to a printed circuit board (PCB). In particular, a BGA package includes an array of conductive pads arranged in a grid pattern on the bottom of the package, each initially with a tiny solder ball stuck to it. These solder balls can be placed on complementary conductive pads of a PCB to form solder connections between the device and the PCB.

SUMMARY

Embodiments of the present disclosure include a passive circuit element. The passive circuit element includes an array of conductive pads arranged on a substrate such that a gap is formed between each of the conductive pads. The passive circuit element further includes a first wire electrically connected to a first conductive pad of the array of conductive pads such that the first wire passes through a first gap formed between a second conductive pad and a third conductive pad. The passive circuit element further includes a second wire electrically connected to a fourth conductive pad of the array of conductive pads such that the second wire passes through the first gap. At least one of the second and third conductive pads has a substantially planar side facing toward the first gap.

Additional embodiments of the present disclosure include a passive circuit element. The passive circuit element includes an array of conductive pads arranged in a plurality of rows and columns such that a center of each conductive pad is arranged on a respective column line and on a respective row line. A perimeter of a first conductive pad is asymmetrical relative to its respective row line and relative to its respective column line.

Additional embodiments of the present disclosure include a passive circuit element. The passive circuit element includes a pair of high speed differential signaling traces including a first wire and a second wire. The passive circuit element further includes an array of conductive pads spaced apart from one another such that a gap is formed between each pair of adjacent conductive pads. Each conductive pad has a center and a perimeter. A first gap is formed between a first conductive pad and a second conductive pad. At least one of the first conductive pad and the second conductive pad includes a trimmed perimeter portion in which the respective perimeter is nearer to the respective center than a remaining perimeter portion of the respective perimeter is to the respective center. The trimmed perimeter portion faces toward the first gap. The first and second wires pass through the first gap.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 2 illustrates an example of a conductive pad to be used in the passive circuit element of FIG. 1, in accordance with embodiments of the present disclosure.

FIG. 3 illustrates an example of a conductive pad to be used in the passive circuit element of FIG. 1, in accordance with embodiments of the present disclosure.

FIG. 4 illustrates an example of a conductive pad to be used in the passive circuit element of FIG. 1, in accordance with embodiments of the present disclosure.

FIG. 5 illustrates an example of a conductive pad to be used in the passive circuit element of FIG. 1, in accordance with embodiments of the present disclosure.

FIG. 10 illustrates an example of a passive circuit element, in accordance with embodiments of the present disclosure.

DETAILED DESCRIPTION

Figure 1:
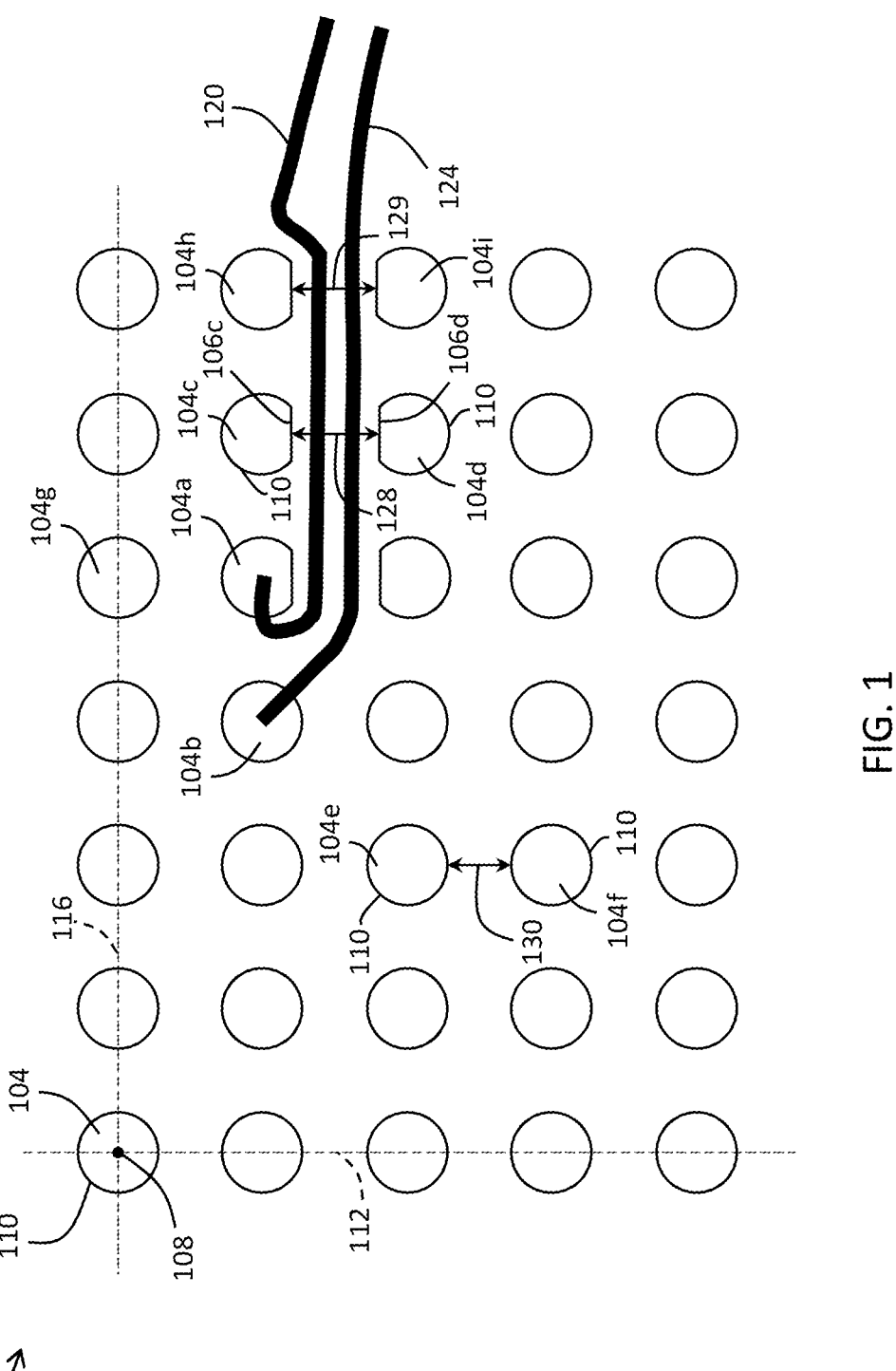
FIG. 1 illustrates an example of a passive circuit element, in accordance with embodiments of the present disclosure.

Aspects of the present disclosure relate generally to the electrical, electronic, and computer fields. In particular, the present disclosure relates to electronic devices commonly assembled in electronic packages. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, as mentioned above, an integrated circuit is a set of electronic circuits on a small flat piece of semiconductor material. Integrated circuits typically include packaging, which supports the electrical contacts which connect the device to a circuit board. A package including a ball grid array (BGA) has a plurality of conductive pads arranged in a grid pattern on the bottom of the package, which are used to form solder connections with complementary conductive pads of a circuit board. As used herein, the term "passive circuit element" refers to surface physical features of a circuit board. A passive circuit element may include, by way of non-limiting example, an array of conductive pads, such as a BGA, and/or one or more wires for electrical connection with other components.

Differential signaling is a method for electrically transmitting information using two complementary signals. The technique includes sending the same electrical signal as a differential pair of signals, each in its own conductor. The pair of conductors can be, for example, traces, also referred to herein as wires, on a printed circuit board (PCB). Electrically, the two conductors carry voltage signals which are equal in magnitude, but of opposite polarity. The receiving electronic circuit responds to the difference between the two signals, which results in a signal with a magnitude that is twice as large.

The path along which each conductor of the pair of conductors is arranged on the PCB, from the connected electronic circuit to outside of the PCB, may be referred to as a wiring escape. When routing differential signals across common PCB materials, each trace of the pair will experience different dielectric constants and corresponding signal velocities due to, for example, differences in static permittivity of the fiberglass weave and epoxy that comprise a PCB. As signals travel faster when the static permittivity is lower, an interpair skew can develop if a signal in a differential pair travels over a higher ratio of fiberglass or epoxy than does its companion signal. This skew between the differential signals can cause significant performance issues such as signal noise and electromagnetic interference. The extent of the problem will depend on various aspects of the arrangement of the traces including, for example, the lengths of the traces and the trace geometries. Because both traces cannot occupy the same space and must be connected to different contacts of the device, some differences in the lengths and geometries of the traces are inevitable. However, as signal speeds get faster, the impacts of such differences are magnified. Accordingly, minimizing these differences may improve signal propagation and chip performance.

Notably, reducing differences in lengths may increase differences in geometries. For example, one way to minimize differences in trace lengths is to introduce serpentine routing to the shorter trace to increase the length of the shorter trace. More specifically, small bends may be added to the route of the shorter trace that perform no desirable function other than to increase the length of the shorter trace. However, introducing such serpentine routing increases differences in geometries between the traces.

As noted above, because the traces must be connected to different contacts of the device, a length discrepancy between the traces is inherently introduced at the locations of the device contacts. It is desirable to compensate for this discrepancy as close as possible to the location where it occurs so that the differences in lengths do not lead to differences in the signals being propagated down the remaining length of the trace. Accordingly, modifying the geometry of the traces as close as possible to the discrepancy in lengths at the device contacts reduces the impacts of such discontinuities on signal propagation.

However, in order to modify the geometry of the trace as close as possible to the device contact, there must be enough space between the device contacts to accommodate the additional space that modifications in trace geometry, like serpentine routing, will require. Moreover, there must be enough space between the device contacts that the traces pass on their wiring escape routes to accommodate both traces in order to enable correcting for the discontinuity at the desired location.

Embodiments of the present disclosure may enable improved wiring escape to accomplish the above objectives by trimming solder pads in a BGA to provide additional space between adjacent pads. As discussed in further detail below, such embodiments provide additional clearance between closely spaced contact pads to accommodate both traces of a high speed differential pair. Accordingly, such embodiments enable improved flexibility in design and arrangement of contacts and traces without negatively impacting performance. For example, as discussed in further detail below, embodiments of the present disclosure may enable designs in which the traces form electrical connections with interiorly located contact pads of the BGA, rather than just exteriorly located contact pads of the BGA. Additionally, embodiments of the present disclosure may enable designs to accommodate wider traces, if desired, providing additional flexibility in application. Additionally, embodiments of the present disclosure may enable designs in which wider traces or double traces can be accommodated in tightly pitched BGAs where they would not otherwise be able to be accommodated.

As described in further detail below, embodiments of the present disclosure may further enable spacing other metal features more closely to solder pads of a BGA or more closely to one another by trimming pads that are electrically connected to the other metal features or by trimming pads of the other metal features themselves in the same manner as described above. For example, embodiments of the present disclosure may include trimming the surface layer of via or through hole pads in substantially the same manner as the solder pads to enable even closer spacing of vias or through holes and pads. Such embodiments may further enable flexibility in design by, for example, increasing density and/or providing additional space to accommodate additional components in the overall design.

FIG. 1 depicts an example of a passive circuit element 100 according to at least one embodiment of the present disclosure. As shown, the passive circuit element 100 includes an array of conductive pads 104 arranged on a substrate (not shown). In particular, the conductive pads 104 are solder pads of a BGA which can be used to connect one or more devices to a chip. Typically, the conductive pads 104 are arranged in evenly spaced columns and rows to form a grid array. In other words, each conductive pad 104 has a center 108 which is arranged on a column line 112 and a row line 116 (indicated with dashed lines). One such center 108, column line 112, and row line 116 are shown illustratively in FIG. 1. The centers 108 of the conductive pads 104 that are arranged in the same column of the grid array are on the same column line 112. Likewise, the centers 108 of the conductive pads 104 that are arranged in the same row of the grid array are on the same row line 116. The column lines 112 of the grid array are equally spaced from one another, and the row lines 116 of the grid array are equally spaced from one another. In alternative embodiments, it is possible for column lines 112 and/or row lines 116 to be un-equally spaced from one another, depending on the application and design. However, in a typical BGA, the column lines 112 and row lines 116 are equally spaced from one another as shown in the illustrative embodiment of FIG. 1.

In addition to a center 108, each conductive pad 104 has a perimeter 110 which is spaced apart from its center 108. Typically, conductive pads 104 have substantially circular perimeters 110 to simplify fabrication of the conductive pads 104 as well as to enable robust and efficient connections with the solder balls placed thereon.

The passive circuit element 100 further includes a high speed differential pair of signaling traces in the form of surface wires, including a first wire 120 and a second wire 124. The first and second wires 120, 124 provide an electrical connection between a device and a chip by their connections to conductive pads 104. More specifically, the first wire 120 is electrically connected to a first conductive pad 104a, and the second wire 124 is electrically connected to a second conductive pad 104b of the BGA. Necessarily, the first and second conductive pads 104a, 104b must be different from one another in order to prevent shorting the connection. Additionally, the first and second conductive pads 104a, 104b should be adjacent to one another to minimize length and geometry discrepancies between the first and second wires 120, 124.

As shown, in order to connect to the first and second conductive pads 104a, 104b, the first and second wires 120, 124 pass through a gap 128 between the perimeters 110 of adjacent conductive pads 104c and 104d. The adjacent conductive pads 104c, 104d between which the illustrative gap 128 is formed can be referred to as third and fourth conductive pads, respectively, for clarity.

As used herein, the term "adjacent" or "immediately adjacent" refers to two conductive pads that are next to one another in a column or a row such that no other conductive pad is arranged between the two conductive pads. A gap, such as gap 128, is formed between each pair of two adjacent conductive pads 104 in the grid array.

As further shown in FIG. 1, the perimeter 110 of each of the third and fourth conductive pads 104c, 104d has been altered from the typical circular shape. More specifically, the perimeters 110 of each of the third and fourth conductive pads 104c, 104d have been trimmed or truncated such that a portion of the circle has been removed. In the embodiment shown in FIG. 1, the perimeters 110 of the third and fourth conductive pads 104c, 104d do not form a complete circle, but include a chord of the circle, such that the smaller portion of the circle formed by the chord is eliminated from the perimeter. As a result, the perimeter length of the third and fourth conductive pads 104c, 104d is less than it would be if the perimeters 110 were circular.

The third conductive pad 104c, trimmed such that the perimeter 110 includes the substantially planar side 106c, is shown in more detail in FIG. 2. As used herein, the term "substantially planar" refers to a surface on which substantially all of the points making up the surface are arranged on the same plane as one another. Further, the term "substantially planar" allows for some insubstantial or inconsequential amount of the points making up the surface to not be arranged on the same plane so long as the overall function achieved by the planarity of the surface is not impacted. For example, the substantially planar surface may be very slightly convex or concave, so long as the overall function achieved by the planarity of the surface, namely the controlled widening of the respective gap, as discussed in further detail below, is not impacted.

The following description of the third conductive pad 104c applies to all trimmed conductive pads of the array. Accordingly, for the following description of the shape of the trimmed third conductive pad 104c, the third conductive pad 104c will be referred to as a trimmed conductive pad 104c.

As shown in FIG. 2, the perimeter 110 of the trimmed conductive pad 104c is circular except for where it includes a chord of the circle, which forms the substantially planar surface 106c. The substantially planar surface 106c can also be referred to as a first portion of the perimeter 110 wherein the remainder of the perimeter 110 is referred to as a second portion of the perimeter 110. In such embodiments, the first portion 106c is nearer to the center 108 of the trimmed conductive pad 104c than the second portion 110 is to the center 108 of the trimmed conductive pad 104c.

As shown in FIG. 2, the perimeter 110 of the trimmed conductive pad 104c, is symmetrical relative to the column line 112 on which it is arranged. In other words, if the trimmed conductive pad 104c is folded along the column line 112 on which its center 108 is arranged, the perimeter 110 is symmetrical on each side of the column line 112. Conversely, the perimeter 110 of the trimmed conductive pad 104c is asymmetrical relative to the row line 116 on which its center 108 is arranged. In other words, if the trimmed conductive pad 104c is folded along the row line 116, the perimeter is not symmetrical on each side of the row line 116.

In alternative embodiments, different perimeter shapes are possible for the trimmed conductive pads depending on the design and application. It is possible to trim the conductive pads on multiple sides to widen gaps on multiple sides of the conductive pad. For example, as shown in FIG. 3, the trimmed conductive pad 104c can be trimmed on a side 107c in substantially the same manner as side 106c. In such embodiments, the trimmed conductive pad 104c has a first substantially planar side 106c and a second substantially planar side 107c arranged opposite the first substantially planar side 106c. More specifically, the second substantially planar side 107c is arranged substantially parallel to the first substantially planar side 106c. In such embodiments, the perimeter 110 of the trimmed conductive pad 104c is symmetrical relative to the column line 112 on which its center 108 is arranged and is also symmetrical relative to the row line 116 on which its center 108 is arranged. Such trimmed conductive pads 106c widen gaps formed on opposite sides of the conductive pad.

In an alternative embodiment, the second substantially planar side 107c can be arranged substantially perpendicular to the first substantially planar side 106c. In such embodiments, the perimeter 110 of the trimmed conductive pad 104c is asymmetrical relative to the column line 112 on which its center 108 is arranged and is asymmetrical relative to the row line 116 on which its center 108 is arranged. Such trimmed conductive pads 106c widen gaps formed on adjacent sides of the conductive pad.

In another alternative embodiment, the second substantially planar side 107c can be arranged such that it is neither substantially parallel nor substantially perpendicular to the first substantially planar side 106c. In such embodiments, the perimeter 110 of the trimmed conductive pad 104c is asymmetrical relative to the column line 112 on which its center 108 is arranged and is asymmetrical relative to the row line 116 on which its center 108 is arranged. Such trimmed conductive pads 106c widen gaps that are not necessarily aligned with column or row lines 112, 116.

In another alternative embodiment, shown in FIG. 4, the trimmed conductive pad 104c can be trimmed such that the perimeter 110 includes a third substantially planar side 105c. In the example shown in FIG. 4, the first substantially planar side 106c is substantially parallel to the second substantially planar side 107c, and third substantially planar side 105c is substantially perpendicular to the first and second substantially planar sides 106c, 107c. In such embodiments, the perimeter 110 of the trimmed conductive pad 104c is asymmetrical relative to the column line 112 on which its center 108 is arranged and is asymmetrical relative to the row line 116 on which its center 108 is arranged. As discussed above, different arrangements of the substantially planar sides 105c, 106c, 107c relative to one another are possible in alternative embodiments.

In another alternative embodiment, shown in FIG. 5, the trimmed conductive pad 104c can be trimmed such that the perimeter 110 includes a fourth substantially planar side 109c. In the example shown in FIG. 5, the first and second substantially planar sides 106c, 107c are substantially parallel to one another and the third and fourth substantially planar sides 105c, 109c are substantially parallel to one another. In such embodiments, the perimeter 110 of the trimmed conductive pad 104c is symmetrical relative to the column line 112 on which its center 108 is arranged and is symmetrical relative to the row line 116 on which its center 108 is arranged. As discussed above, different arrangements of the substantially planar sides 105c, 106c, 107c, 109c relative to one another are possible in alternative embodiments.

One example application of the trimmed conductive pads 104c shown in FIGS. 4 and 5 is to increase the flexibility of wiring between rows and columns of an array. More specifically, because the trimmed conductive pads 104c shown in FIGS. 4 and 5 are trimmed on two adjacent sides, such pads facilitate the ability of wiring to make a 90° turn from being arranged along one trimmed side to being arranged along the adjacent trimmed side. Accordingly, an array could be made using all or multiple trimmed conductive pads 104c such as those shown in FIGS. 4 and 5 to enable wiring paths including any number of 90° turns along adjacent trimmed sides. Such an array could be designed to including such trimmed pads only along the designed wiring path. Alternatively, such an array could be designed to include all such trimmed pads to provide flexibility for a subsequently designed wiring path. An alternative trimmed conductive pad 104c that could also be useful for such applications could be trimmed only on two adjacent sides to minimize the reduction in overall surface area of the pad.

As illustrated by the different embodiments discussed above, the trimmed conductive pad 104c can be trimmed to form a variety of perimeter shapes depending on design constraints and applications. Moreover, corners or interfaces between trimmed portions can be rounded or linear. As noted above, the particular shape of the perimeter of each conductive pad is limited in part by fabrication practicalities and by its ability to enable a robust and efficient connection with a solder ball. In some embodiments, the overall surface area of the conductive pad may be increased to compensate for surface area lost by trimming.

Returning to FIG. 1, as a result of their trimmed shape, each of the third and fourth conductive pads 104c, 104d includes a substantially planar side 106c, 106d, respectively. The third and fourth conductive pads 104c, 104d are arranged such that the substantially planar sides 106c, 106d both face toward the gap 128.

As shown in FIG. 1, the arrangement of the third and fourth conductive pads 104c, 104d such that the substantially planar sides 106c, 106d face toward the gap 128 allows the gap 128 to be widened relative to a gap that would be formed by typical circular conductive pads. For example, FIG. 1 includes fifth and sixth conductive pads 104e, 104f, which are not trimmed, and which are separated by a gap 130. The gap 128 formed between the substantially planar sides 106c, 106d of the third and fourth conductive pads 104c, 104d is wider than the gap 130 formed between circular perimeters 110 of the fifth and sixth conductive pads 104e, 104f. Moreover, the gap 128 formed between substantially planar sides 106c, 106d of the third and fourth conductive pads 104c, 104d is wider than a gap formed by the circular (non-trimmed, non-substantially planar) surfaces of trimmed third and fourth conductive pads 104c, 104d.

In order to prevent shorting, the first and second wires 120, 124 cannot contact one another or any conductive pads other than the first and second conductive pads 104a, 104b, respectively. Accordingly, from a practical fabrication standpoint, minimum tolerances or clearances must be designed between each of the wires 120, 124 as well as between the wires 120, 124 and each of the conductive pads 104 past which the wires 120, 124 will be routed.

By widening the gap 128, the passive circuit element 100 creates additional clearance between the third and fourth conductive pads 104c, 104d for the first and second wires 120, 124. Accordingly, trimming the conductive pads 104c, 104d enables using thicker wires, if desired. Trimming the conductive pads 104c, 104d also enables the first and second wires 120, 124 to be routed through a BGA having tighter pitches between conductive pads 104. Additionally, trimming the conductive pads 104c, 104d also enables correcting for discrepancies between the wires 120, 124 close to where the differences occur.

In the embodiment shown in FIG. 1, the first conductive pad 104a is trimmed in the same manner as the third and fourth conductive pads 104c, 104d. In alternative embodiments, depending on the design considerations and constraints, it is possible for the first conductive pad 104a to be untrimmed. Similarly, depending on the design considerations and constraints, it is possible for other conductive pads 104 in the BGA to be trimmed wherever it is desirable to create additional clearance between conductive pads.

Additionally, in the embodiment shown in FIG. 1, both the third and fourth conductive pads 104c, 104d have been trimmed. However, depending on design considerations and constraints, in alternative embodiments it is possible for only one of the third and fourth conductive pads 104c, 104d to be trimmed, thereby increasing the gap 128 by a smaller amount than in embodiments where both the third and fourth conductive pads 104c, 104d are trimmed.

A BGA includes external conductive pads and internal conductive pads. External conductive pads are arranged in the grid array such that they form the exterior edges of the array. Internal conductive pads are arranged in the interior of the grid array, within the exterior edges formed by the external conductive pads. Typically, trace wires are coupled to external conductive pads due to spacing constraints between the conductive pads which are too narrow to enable trace wires, and especially pairs of trace wires, to be routed between conductive pads to be connected to internal conductive pads.

However, as described above with respect to FIG. 1, embodiments of the present disclosure enable increasing spacing between adjacent conductive pads, and the wider gaps created by trimming adjacent pads may be able to accommodate the passage of pairs of trace wires therethrough. Accordingly, embodiments of the present invention increase design flexibility by enabling trace wires to be electrically coupled to internal conductive pads rather than being limited to being electrically coupled to external conductive pads.

In the embodiment of the passive circuit element 100 shown in FIG. 1, the first, second, third, and fourth conductive pads 104a, 104b, 104c, and 104d are all internal conductive pads. Accordingly, the first conductive pad 104a is separated from the exterior edge of the grid array of conductive pads 104a by an external conductive pad in each direction on each row and each column in which the first conductive pad 104a is arranged. For example, a seventh conductive pad 104g is an external conductive pad and separates the first conductive pad 104a from an exterior edge of the array in a first direction along the column line on which the first conductive pad 104a is arranged.

The seventh conductive pad 104g is illustrative of external conductive pads which separate interior conductive pads from the exterior edge of the array in each direction on the grid array. Depending on design constraints and considerations, the seventh conductive pad 104g can be circular, as is shown in FIG. 1. Alternatively, if the seventh conductive pad 104g is one which forms a gap for a wire or pair of wires, the seventh conductive pad 104g may also be trimmed. For example, eight and ninth conductive pads 104h, 104i, respectively, are external conductive pads and are also trimmed conductive pads.

Illustratively, in the embodiment shown in FIG. 1, the first conductive pad 104a is separated from the top exterior edge of the array by the seventh conductive pad 104g, which is an external conductive pad. The first conductive pad 104a is also separated from the right exterior edge of the array by the third conductive pad 104c, which is an internal conductive pad, and the eighth conductive pad 104h, which is an external conductive pad. In alternative embodiments, different arrangements of the passive circuit element 100 are possible in which the conductive pads 104 may be differently arranged.

Figure 6:
FIG. 6 illustrates an example of a passive circuit element, in accordance with embodiments of the present disclosure.

FIG. 6 depicts an alternative embodiment of a passive circuit element 600, which is substantially similar to the passive circuit element 100 shown in FIG. 1, except that the third and fourth conductive pads 604c, 604d are external conductive pads instead of internal conductive pads. In other words, in accordance with at least some embodiments of the present disclosure, at least one of the third and fourth conductive pads 604c, 604d is an external conductive pad. Put another way, at least one of the third and fourth conductive pads 604c, 604d can also be the seventh conductive pad 604g. Other than this difference, the passive circuit element 600 is substantially similar in structure and function to the passive circuit element 100.

Figure 7:
FIG. 7 illustrates an example of a passive circuit element, in accordance with embodiments of the present disclosure.

In the embodiment shown in FIG. 1, the first and second conductive pads 104a, 104b are arranged adjacent to one another in the same row. However, as shown in FIG. 7, in alternative embodiments, the first and second conductive pads 704a, 704b can be arranged adjacent to one another in the same column instead of in the same row. Other than this difference, the passive circuit element 700 is substantially similar in structure and function to the passive circuit element 100.

Figure 8:
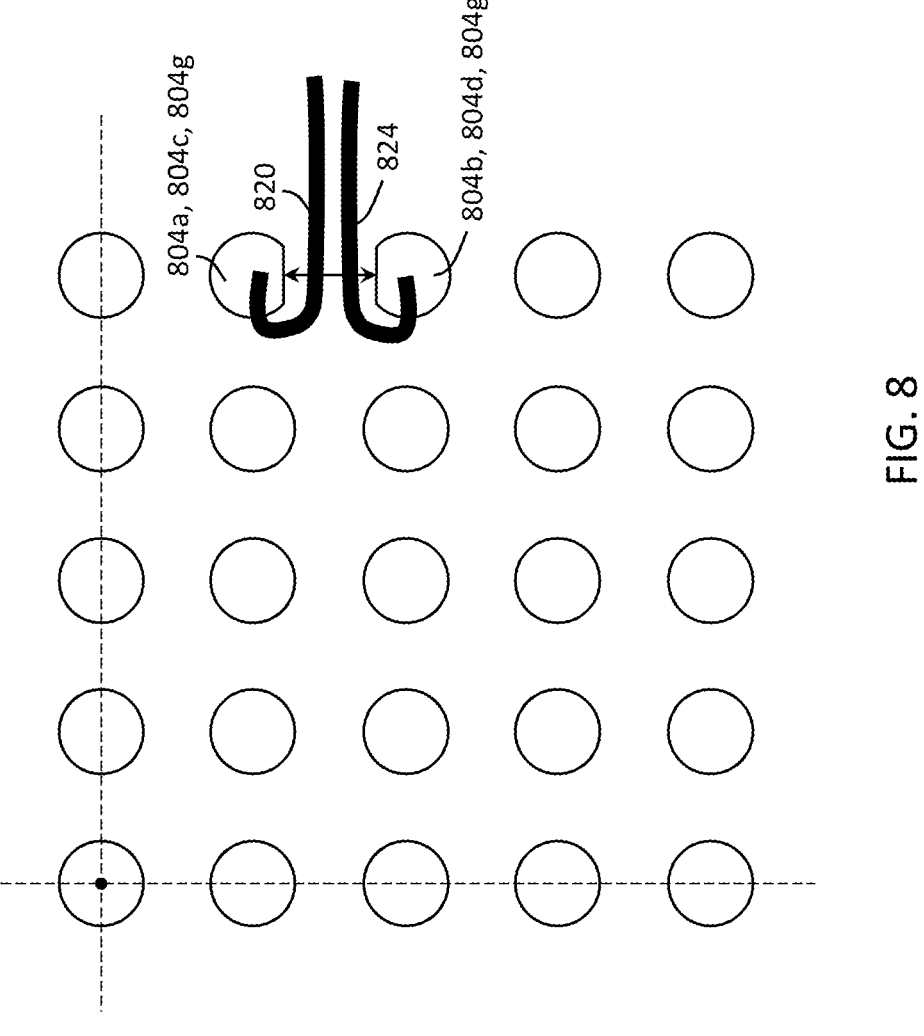
FIG. 8 illustrates an example of a passive circuit element, in accordance with embodiments of the present disclosure.

In the embodiment shown in FIG. 7, the first and second conductive pads 704a, 704b are internal conductive pads. However, as shown in FIG. 8, in alternative embodiments, the first and second conductive pads 804a, 804b are external conductive pads. In other words, in accordance with at least some embodiments of the present disclosure, at least one of the first and second conductive pads 804a, 804b is an external conductive pad. Put another way, at least one of the first and second conductive pads 804a, 804b can also be the seventh conductive pad 804g.

In any of the above embodiments, a number of different arrangements are possible. For example, if, as shown in FIG. 8, the first and second conductive pads are adjacent to one another in the same column, both the first and second conductive pads can be external conductive pads on the right or left exterior edge of the array. Otherwise, if the first and second conductive pads are adjacent to one another in the same row, one of the first and second conductive pads can be an external conductive pad on the right or left exterior edge of the array, and the other can be an internal conductive pad.

Alternatively, if the first and second conductive pads are adjacent to one another in the same column, one of the first and second conductive pads can be an external conductive pad on the top or bottom exterior edge of the array and the other can be an internal conductive pad. Otherwise, if the first and second conductive pads are adjacent to one another in the same row, both the first and second conductive pads can be external conductive pads on the top or bottom exterior edge of the array.

In the embodiment shown in FIG. 8, because both the first and second conductive pads 804a, 804b are external conductive pads, the only gap through which the first and second wires 820, 824 pass is between the first and second conductive pads 804a, 804b. Accordingly, in such embodiments, at least one of the first and second conductive pads 804a, 804b is also trimmed. Accordingly, in such embodiments, the first conductive pad 804a can also be the third conductive pad 804c and/or the second conductive pad 804b can also be the fourth conductive pad 804d.

For embodiments in which one of the first and second conductive pads is an external conductive pad and the other is an internal conductive pad, it is possible for either or both of the first and second conductive pads to be trimmed. More broadly, for any embodiment in which either of the first and second conductive pads is trimmed, the first and second conductive pads can be third and/or fourth conductive pads forming a gap through which the first and second wires pass.

In general, depending on the arrangement of the passive circuit element, the first conductive pad can be an internal conductive pad or an external conductive pad, the first conductive pad can be trimmed or not trimmed, the first conductive pad can form or not form a gap through which the first and second wires pass. Accordingly, the first conductive pad can be the third or fourth conductive pad and/or the seventh conductive pad. Similarly, the second conductive pad can be an internal conductive pad or an eternal conductive pad, can be trimmed or not trimmed, and can form or not form a gap through which the first and second wires pass. Therefore, the second conductive pad can also be the third or fourth conductive pad and/or the seventh conductive pad. In any of these instances, the first and second conductive pads can be arranged adjacent to one another in the same row or in the same column.

In the embodiment shown in FIG. 1, the first and second wires 120, 124 pass through gaps between rows of conductive pads. In particular, in addition to passing through the gap 128 formed between the third and fourth conductive pads 104c, 104d, which are arranged in adjacent rows in the same column of the array, the first and second wires 120, 124 also pass through a gap 129 formed between the eighth and ninth conductive pads 104h, 104i, which are also arranged in adjacent rows in the same column of the array. More specifically, the eighth conductive pad 104h is arranged in the same row as the third conductive pad 104c, and the ninth conductive pad 104i is arranged in the same row as the fourth conductive pad 104d. Accordingly, in the embodiment shown, the gaps 128, 129 are aligned with one another between these two rows.

In alternative embodiments, the first and second wires 120, 124 can pass through one or more gaps between columns of conductive pads. In such embodiments, each pair of conductive pads between which the wires pass has conductive pads arranged in the same row as one another and arranged in adjacent columns to one another.

In alternative embodiments, depending on design constraints and considerations, the first and second wires 120, 124 can pass through one or more gaps between adjacent columns of conductive pads and can also pass through one or more gaps between adjacent rows of conductive pads.

The embodiment shown in FIG. 1 illustratively includes a single pair of high speed differential signal wires 120, 124. In alternative embodiments, passive circuit elements can include one or more additional pairs of high speed differential signal wires, each connected to their own pair of adjacent conductive pads in the manner described above. Each additional pair of high speed differential signal wires may pass through one or more gaps in the manner described above.

Figure 9:
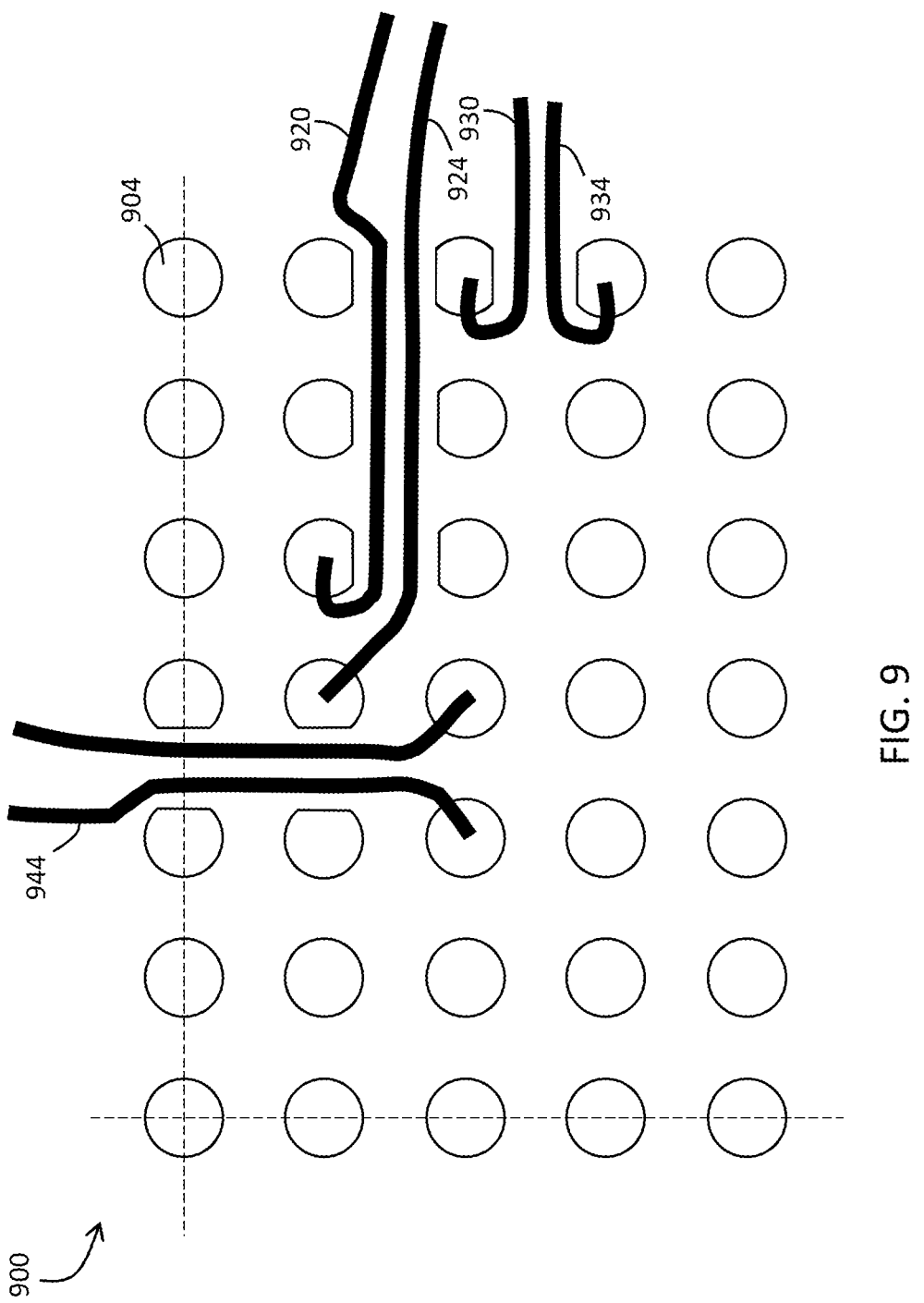
FIG. 9 illustrates an example of a passive circuit element, in accordance with embodiments of the present disclosure.

As an illustrative example, the passive circuit element 900 shown in FIG. 9 includes a first pair of wires 920, 924, a second pair of wires 930, 934, and a third pair of wires 940, 944. Each of the various conductive pads 904 of the array can be connected or not connected to a wire and/or can be trimmed or not trimmed and/or can be internal or external and/or can form a gap or not form a gap through which a wire passes depending on its arrangement relative to each of the wires 920, 924, 930, 934, 940, 944 of the passive circuit element 900. As illustrated in FIG. 9, the various aspects of the present disclosure enable a great increase in the amount of flexibility in the design of integrated circuit elements.

In alternative embodiments of the present disclosure, it is possible for the trimmed conductive pads set forth above to be utilized with a single wire in each instance instead of a pair of wires.

As noted above, in alternative embodiments of the present disclosure, it is possible for the trimmed conductive pads set forth above to be utilized with other metal features and surface pads of a circuit board. For example, the same features and advantages of the trimmed conductive pads described above for solder balls can be utilized for conductive pads for vias or through holes. Moreover, the conductive pads of solder balls in an array can be trimmed and the conductive pads for the other metal features can also be trimmed to further enhance flexibility of function and design. As described in further detail below, trimming both features can enable increased package density.

Moreover, the same features and advantages can be utilized for applications without solder balls. For example, an array of trimmed conductive pads can be used for an array of flexible pin in hole leaded devices to allow holes to be placed closer together to improve layout density. This can also be used for fixed pin through hole devices, like connectors, to achieve greater lateral separation, which improves manufacturability and/or allows for accommodation of wider traces in the design.

As one example of trimming conductive pads of other metal features, the trimmed conductive pads could be utilized with a single wire or trace connected to a via, such as in a "dog-bone" arrangement. As noted above, it is possible for the via pad to be trimmed in substantially the same way as a conductive pad. Accordingly, as explained in further detail below with reference to FIG. 10, embodiments of the present disclosure can also enable trimming conductive pads to increase feature density, rather than to increase space for wiring between pads.

FIG. 10 depicts an array 1100 of conductive pads and via pads used in dog-bone arrangements. Each dog-bone arrangement includes a conductive pad 1104, a wire 1120 connected to the conductive pad 1104, and a via 1150 connected to the conductive pad 1104 by the wire 1120. A minimum spacing must be maintained between the perimeter 1110 of each conductive pad 1104 and the outer perimeter 1154 of the via pad 1152 of each via 1150 to prevent shorting.

The illustrative embodiment depicted in FIG. 10 includes conductive pads 1104a which are un-trimmed and are associated with vias 1150a having via pads 1152a that are un-trimmed. The illustrative embodiment also includes conductive pads 1104b which are trimmed and are associated with vias 1150b having via pads 1152b that are un-trimmed. The illustrative embodiment also includes conductive pads 1104c which are trimmed and are associated with vias 1150c having via pads 1152c that are also trimmed. The trimmed conductive pads 1104b, 1104c and the trimmed via pads 1152c are trimmed in substantially the same manner described above.

As shown, the spacing between the center 1108a of the un-trimmed conductive pad 1104a and the center 1156a of the un-trimmed via pad 1152a is larger than the spacing between the center 1108b of the trimmed conductive pad 1104b and the center 1156a of the un-trimmed via pad 1152b which is larger than the spacing between the center 1108c of the trimmed conductive pad 1104c and the center 1156c of the trimmed via pad 1152c. Accordingly, FIG. 10 illustrates the advantages that can be achieved by applying the same trimming described above to instances wherein the conductive pads are connected to vias. In particular, useful clearance space can be gained between vias and conductive pads in the arrangement.

Notably, due to the spacing required between conductive pads to accommodate vias in the grid array, in the embodiment shown in FIG. 10, trimmed conductive pads 1104*b* are trimmed at an angle relative to the column lines and the via lines. More specifically, the conductive pads 1104*b* and 1104*c* are trimmed such that their perimeters 1110*b* and 1110*c* are asymmetrical relative to the column line 1112 and are asymmetrical relative to the row line 1116. Similarly, the trimmed via pads 1152*c* are trimmed such that their perimeters 1154*c* are asymmetrical relative to the column lines 1112 and asymmetrical relative to the row lines 1116.

In such embodiments, in order to maximize space, the wires 1120 connected to the trimmed conductive pads 1104*b*, 1104*c* extend substantially perpendicularly relative to the substantially planar surfaces formed by trimming the conductive pads 1104*b*, 1104*c*. Similarly, in such embodiments, the wires 112 extend substantially perpendicularly relative to the substantially planar surfaces formed by trimming the via pads 1152*c*.

In alternative embodiments, via pads can also be trimmed in this manner for use in instances without associated conductive pads. In such embodiments, useful clearance space can be gained between the trimmed vias and adjacent structures or components. As discussed above, the same features and advantages of the trimmed conductive pads can be utilized for other metal features of a circuit board.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A passive circuit element, comprising:

an array of conductive pads arranged on a substrate such that a gap is formed between each of the conductive pads;

a first wire electrically connected to a first conductive pad of the array of conductive pads such that the first wire passes through a first gap formed between a second conductive pad and a third conductive pad; and a second wire electrically connected to a fourth conductive pad of the array of conductive pads such that the second wire passes through the first gap, wherein the second conductive pad has a perimeter in a circular shape with a first portion of the perimeter being substantially planar and facing toward the first gap, and wherein the second conductive pad has a second portion of the perimeter being substantially planar and arranged substantially parallel to the first portion of the perimeter.

2. The passive circuit element of claim 1, wherein the first wire and the second wire are a pair of high speed differential signaling traces.

3. The passive circuit element of claim 1, wherein each of the second conductive pad and the third conductive pad has a substantially planar side facing toward the first gap.

4. The passive circuit element of claim 1, wherein a second gap is formed between a fifth conductive pad and a sixth conductive pad, and the first gap is wider than the second gap.

5. The passive circuit element of claim 1, wherein at least one of the second conductive pad and the third conductive pad is electrically connected through the substrate by a trace and a via.

6. The passive circuit element of claim 1, wherein the first conductive pad is separated from an exterior edge of the array of conductive pads by a fifth conductive pad.

7. The passive circuit element of claim 6, wherein the fifth conductive pad is substantially circular.

8. The passive circuit element of claim 6, wherein the fourth conductive pad is separated from the exterior edge by a sixth conductive pad.

9. A passive circuit element, comprising:

a pair of high speed differential signaling traces including a first wire and a second wire;

an array of conductive pads spaced apart from one another such that a gap is formed between each pair of adjacent conductive pads, each conductive pad having a center and a perimeter; wherein:

a first gap is formed between a first conductive pad and a second conductive pad, the first conductive pad includes a trimmed perimeter portion resulting in the perimeter having a circular shape with a first portion of the perimeter being substantially planar and facing toward the first gap in which the trimmed perimeter portion is nearer to the center than a remaining perimeter portion of the perimeter is to the center, the trimmed perimeter portion faces toward the first gap, and the first wire and the second wire pass through the first gap, wherein the first conductive pad has a second portion of the perimeter being substantially planar and the second portion of the perimeter has an arrangement that is selected from a group consisting of being substantially parallel to the first portion of the perimeter and being substantially perpendicular to the first portion of the perimeter.

10. The passive circuit element of claim 9, wherein the first wire is electrically connected to a third conductive pad and the second wire is electrically connected to a fourth conductive pad.

11. The passive circuit element of claim 1, wherein the second conductive pad and the third conductive pad are adjacent to one another.

12. The passive circuit element of claim 9, wherein the first conductive pad and the second conductive pad are adjacent to one another.

13. The passive circuit element of claim 4, wherein the fifth conductive pad and the sixth conductive pad are adjacent to one another.

14. A passive circuit element, comprising:

an array of conductive pads arranged on a substrate such that a gap is formed between each of the conductive pads;

a first wire electrically connected to a first conductive pad of the array of conductive pads such that the first wire passes through a first gap formed between a second conductive pad and a third conductive pad; and a second wire electrically connected to a fourth conductive pad of the array of conductive pads such that the second wire passes through the first gap, wherein the second conductive pad has a perimeter in a circular shape with a first portion of the perimeter being substantially planar and facing toward the first gap, and wherein the second conductive pad has a second portion of the perimeter being substantially planar and arranged substantially perpendicular to the first portion of the perimeter.

15. The passive circuit element of claim 14, wherein the third conductive pad has a perimeter in a circular shape with a first portion of the perimeter being substantially planar and facing toward the first gap, and wherein the third conductive pad has a second portion of the perimeter being substantially planar and arranged substantially perpendicular to the first portion of the perimeter.

16. The passive circuit element of claim 1, wherein the third conductive pad has a perimeter in a circular shape with a first portion of the perimeter being substantially planar and facing toward the first gap, and wherein the third conductive pad has a second portion of the perimeter being substantially planar and arranged substantially parallel to the first portion of the perimeter.

17. The passive circuit element of claim 9, wherein the second conductive pad includes a trimmed perimeter portion resulting in the perimeter having a circular shape with a first portion of the perimeter being substantially planar and facing toward the first gap in which the trimmed perimeter portion is nearer to the center than a remaining perimeter portion of the perimeter is to the center, and wherein the second conductive pad has a second portion of the perimeter being substantially planar and the second portion of the perimeter has an arrangement that is selected from a group consisting of being substantially parallel to the first portion of the perimeter and being substantially perpendicular to the first portion of the perimeter.

* * * * *